US011251321B2

(12) United States Patent
    Guiot et al.

(10) Patent No.: US 11,251,321 B2
(45) Date of Patent: Feb. 15, 2022

(54) ENGINEERED SUBSTRATE WITH EMBEDDED MIRROR

(71) Applicants: Soitec, Bernin (FR); Commissariat A L'Energie Atomique et aux Energies Alternatives, Paris (FR)

(72) Inventors: Eric Guiot, Goncelin (FR); Aurelie Tauzin, Saint-Egréve (FR); Thomas Signamarcheix, Grenoble (FR); Emmanuelle Lagoutte, St. Marcellin (FR)

(73) Assignees: Soitec, Bernin (FR); Commissariat A L'Energie Atomigue et aux Energies Alternatives, Paris (FR)

( * ) Notice: Subject to any disclaimer, the term of this patent is extended or adjusted under 35 U.S.C. 154(b) by 719 days.

(21) Appl. No.: 16/074,342

(22) PCT Filed: Jan. 27, 2017

(86) PCT No.: PCT/EP2017/051751
    § 371 (c)(1),
    (2) Date: Jul. 31, 2018

(87) PCT Pub. No.: WO2017/133976
    PCT Pub. Date: Aug. 10, 2017

(65) Prior Publication Data
    US 2021/0193853 A1    Jun. 24, 2021

(30) Foreign Application Priority Data
    Feb. 3, 2016 (FR) ...................................... 1650859

(51) Int. Cl.
    *H01L 31/043*    (2014.01)
    *H01L 31/18*    (2006.01)
    (Continued)

(52) U.S. Cl.
    CPC .......... *H01L 31/043* (2014.12); *H01L 21/187* (2013.01); *H01L 31/0547* (2014.12);
    (Continued)

(58) Field of Classification Search
    CPC ............. H01L 31/0547; H01L 31/0725; H01L 31/0735; H01L 31/1896; H01L 21/187;
    (Continued)

(56) References Cited

U.S. PATENT DOCUMENTS 8,648,387 B2 *  2/2014  Tsay ................... H01L 21/02664
                                                         257/189
9,650,723 B1 *  5/2017  D'Evelyn ............ H01L 21/2007
(Continued)

FOREIGN PATENT DOCUMENTS

CN    102270693 B    9/2013
CN    103975449 A    8/2014
(Continued)

OTHER PUBLICATIONS

Japanese Notice of Reasons for Rejection for Japanese Application No. 2018-537634 dated Sep. 3, 2019, 2 pages.
(Continued)

*Primary Examiner* — David Vu
*Assistant Examiner* — Brandon C Fox
(74) *Attorney, Agent, or Firm* — TraskBritt

(57) ABSTRACT

An engineered substrate comprising: a seed layer made of a first semiconductor material for growth of a solar cell; a first bonding layer on the seed layer; a support substrate made of a second semiconductor material; a second bonding layer on a first side of the support substrate; a bonding interface between the first and second bonding layers; the first and second bonding layers each made of metallic material; wherein doping concentration and thickness of the engineered substrate, in particular, of the seed layer, the support
(Continued)

substrate, and both the first and second bonding layers, are selected such that the absorption of the seed layer is less than 20%, preferably less than 10%, as well as total area-normalized series resistance of the engineered substrate is less than 10 mOhm·cm$^2$, preferably less than 5 mOhm·cm$^2$.

20 Claims, 2 Drawing Sheets

(51) Int. Cl.
   *H01L 31/0725* (2012.01)
   *H01L 31/054* (2014.01)
   *H01L 21/18* (2006.01)
   *H01L 31/0735* (2012.01)

(52) U.S. Cl.
   CPC ...... *H01L 31/0725* (2013.01); *H01L 31/0735* (2013.01); *H01L 31/1896* (2013.01); *H01L 2224/80895* (2013.01); *H01L 2224/81895* (2013.01); *H01L 2224/82896* (2013.01)

(58) Field of Classification Search
   CPC . H01L 2224/80895; H01L 2224/81895; H01L 2224/82896
   USPC .......................................... 136/255; 438/455
   See application file for complete search history.

(56) References Cited

U.S. PATENT DOCUMENTS

| | | | |
|---|---|---|---|
| 2006/0255341 A1 | 11/2006 | Pinnington et al. | |
| 2011/0303288 A1* | 12/2011 | Boca | H01L 21/2007 136/261 |
| 2012/0138116 A1* | 6/2012 | Bhusari | H01L 29/205 136/244 |
| 2013/0001731 A1* | 1/2013 | Forrest | H01L 27/1446 257/443 |
| 2013/0206219 A1 | 8/2013 | Kurtin et al. | |
| 2014/0137930 A1* | 5/2014 | Derkacs | H01L 31/043 136/255 |
| 2015/0027519 A1 | 1/2015 | Ghyselen et al. | |
| 2015/0083202 A1* | 3/2015 | Ghyselen | H01L 31/03046 136/255 |
| 2015/0380592 A1* | 12/2015 | Newman | H01L 31/043 136/255 |

FOREIGN PATENT DOCUMENTS

| | | |
|---|---|---|
| CN | 103367465 B | 1/2016 |
| JP | 63-157483 A | 6/1988 |
| JP | 2002-289884 A | 10/2002 |
| JP | 5994465 B2 | 9/2016 |
| WO | 2013/042526 A1 | 3/2013 |
| WO | 2013143851 A1 | 10/2013 |
| WO | 2014154993 A1 | 10/2014 |

OTHER PUBLICATIONS

Japanese Notice of Reasons for Refusal for Japanese Application No. 2018-537634, dated Aug. 29, 2019, 4 pages with English Translation.
Japanese Notice of Reasons for Rejection for Japanese Application No. 2018-537634 dated Dec. 17, 2019, 2 pages.
Japanese Search Report for Japanese Application No. 2018-537634, dated Aug. 20, 2019, 42 pages with English Translation.
Japanese Written Opinion for Japanese Application No. 2018-537634, dated Nov. 15, 2019, 5 pages.
Nikhil Jain et al. and Towards a Monolithic, "Substrate-Reusable and an All-Epitaxial Design for III-V-on-Si Solar Cells", and 2015 IEEE 42 nd Photovoltaic Specialist DOI:10.1109/PVSC.2015. 7356241https: Conference Jun. 14-19, 2015 [/] /ieeexplore.ieee.org/stamp/stamp.jsp?tp=&arnumber=735624.pdf.
International Search Report for International Application No. PCT/EP2017/051751 dated Mar. 6, 2017, 4 pages.
International Written Opinion for International Application No. PCT/EP2017/051751 dated Mar. 6, 2017, 8 pages.

* cited by examiner

ENGINEERED SUBSTRATE WITH EMBEDDED MIRROR

CROSS-REFERENCE TO RELATED APPLICATIONS

This application is a national phase entry under 35 U.S.C. § 371 of International Patent Application PCT/EP2017/051751, filed Jan. 27, 2017, designating the United States of America and published as International Patent Publication WO 2017/133976 A1 on Aug. 10, 2017, which claims the benefit under Article 8 of the Patent Cooperation Treaty to French Patent Application Serial No. 1650859, filed Feb. 3, 2016.

TECHNICAL FIELD

The present disclosure relates to an engineered substrate having an embedded mirror as well as a method of manufacturing an engineered substrate having an embedded mirror.

BACKGROUND

Photovoltaic or solar cells are designed for converting the solar radiation to electrical current. In concentrator solar photovoltaic applications, the incoming sunlight is optically concentrated before it is directed to solar cells. For example, the incoming sunlight is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example. Concentrator photovoltaics may, alternatively or additionally, comprise Fresnel lens optics for the concentration of the incoming solar radiation.

Recently, in the field of optoelectronics applications, e.g., CPV (concentrator photovoltaic) cells, IR (infrared) detectors, etc., interest has focused on recycling photons, reducing losses of photons and reducing resistivity.

One of the problems associated with these issues is the efficiency of the cell. For instance, commonly used substrates such as GaAs substrates need to be doped to ensure a low contact resistance. This doping, however, is inducing increased absorption of photons.

WO2013/143851 discloses a process of manufacturing multijunction (MJ) solar cell devices, including a transfer of a seed layer on a final substrate.

For MJ solar cells, or more generally, "photodetectors," e.g., suitable for a fabrication method of the MJ solar cell as set forth in WO2013/143851 that implies direct bonding of at least two subcells, each of which is grown on a substrate (both substrates having different lattice constants, however), there is a need for proper substrates for improving the efficiency of the light detection or conversion devices based on such substrates.

In view of the above-mentioned problems, it is an object of the present disclosure to provide a sufficiently transparent yet electrically conductive substrate with improved efficiency, for MJ solar cells.

BRIEF SUMMARY

An engineered substrate is provided comprising: a seed layer made of a first semiconductor material for growth of a solar cell; a first bonding layer on the seed layer; a support substrate made of a second semiconductor material; a second bonding layer on a first side of the support substrate; a bonding interface between the first and second bonding layers; the first and second bonding layers each made of metallic material; wherein doping concentrations of the semiconductor materials and thicknesses of the layers of the engineered substrate, in particular, of the seed layer, the support substrate, and both the first and second bonding layers, are selected such that the absorption of the seed layer is less than 20%, preferably less than 10%, as well as total area-normalized series resistance of the engineered substrate is less than 10 mOhm·cm$^2$, preferably less than 5 mOhm·cm$^2$.

In the above-provided engineered substrate, the support substrate may also be termed a receiver substrate. The engineered substrate comprises two non-lattice matched materials, namely, the top thin layer comprising the seed layer and the typically thicker bottom material comprising the support/receiver substrate, e.g., InP for the top thin layer, i.e., the seed layer, and GaAs or Ge for the bottom receiver substrate, i.e., the support substrate. The thin layer of seed layer of a first material can be obtained by several approaches including bonding on the second material. The bonding interface between the first and second bonding layers thereby has the function of a mirror layer of metallic material in order to better reflect photons. The term "mirror layer" is used herein to define a metallic layer exhibiting a high reflection coefficient (sup. 70%) in the 400 nm-2000 nm wavelength range. The incoming photons that have not been absorbed by the active device grown on top of the seed layer during their first path can then be reflected at the mirror layer and be reinjected in the active device for absorption. The proximity of the mirror bonding layers with the active device ensures a high photon collection probability, leading to improved device characteristics (current, efficiency, etc.).

The electrical resistivity is an intrinsic property that quantifies how strongly a given material opposes the flow of electric current. A low resistivity indicates a material that readily allows the movement of electric charge. Resistivity is commonly represented by the Greek letter ρ (rho). The unit of electrical resistivity derives from the product of the resistance R with the surface area or cross-sectional area A of the solar cell or the engineered substrate, respectively. As a formula, this is R·A=ρ·l, where l represents the length or thickness that is substantially perpendicular to the area A. The unit of electrical resistivity ρ thus is Ohmmeter (Ω·m) although other units like Ohm·centimeter (Ω·cm) are also commonly employed.

The series resistance represents one of the major resistive effects in a solar cell. A high series resistance may reduce the fill factor and thereby ultimately the efficiency of the solar cell. In order to make values comparable, the values are area-normalized so as to multiply the resistance with an area, which is the same as using the current density instead of the current in Ohm's law, thereby obtaining a unit of Ohm·centimeter$^2$, i.e., Ω-cm$^2$.

The absorption being less than 20% should be understood as the seed layer should only absorb less than 20% of the incident light, when the light travels once through the layer, so that at least 80% of the incident light is transmitted through the layer and can be reflected at the mirror layer.

For the engineered substrate, the doping concentration of the seed layer may be less than 5×10$^{17}$ at/cm$^3$. In the engineered substrate, the thickness of seed layer may be a range of 150 nm to 1 μm. For instance, the doping concentration of the seed layer may be about 3×10$^{18}$ at/cm$^3$ with a thickness of about 300 nm.

In the engineered substrate, the thickness of support substrate may be in a range from 100 µm up to 500 µm and the doping concentration of the support substrate may be in the range $10^{14}$ to $5 \times 10^{17}$ at/cm$^3$.

In the engineered substrate, the metallic material of the first and second bonding layers may be one of W or Ti together with TiN.

In the engineered substrate, the first semiconductor material may have a lattice constant in the range of 5.8 to 6 Å (0.58 to 0.6 nm).

These values typically correspond to the lattice constant of InP. The support substrate typically is the final substrate. For the case of directly bonded MJ cells, the subcell grown on this substrate should have the lowest energy gaps, which is only possible to achieve with materials having lattice constants around the lattice constant of InP.

In the engineered substrate, the first semiconductor material may be InP or the first semiconductor material may be a ternary or quaternary or penternary III-V material, for example, InGaAs or InGaAsP, and the second semiconductor material may be GaAs or Ge.

The engineered substrate may further comprise a metal contact provided on a second side of the support substrate opposite to the first side to collect the generated electrons.

The back side metal contact may also serve as a back side mirror. Typically, it is placed right below the support substrate in order to prevent or at least minimize losses of photons by reflecting them back toward the support substrate and further, at least partially, to the active layer of the solar cell. Photons may thus be recycled by the mirror and the loss of photons is reduced. The above-mentioned area-normalized series resistance of the engineered substrate has the further effect of providing electrical connection of the cell to the back side metal contact.

Further provided is a light detection or conversion device, in particular, a solar cell, comprising an engineered substrate as described above.

Further provided is a method of manufacturing an engineered substrate comprising: providing a first substrate; providing a seed layer on a first side of the first substrate; forming a first bonding layer of metallic material on the seed layer; providing a support substrate; forming a second bonding layer of metallic material on the support substrate; directly bonding the first and second bonding layers; and then removing the first substrate; the first and second bonding layers each made of metallic material; wherein doping concentrations of the semiconductor materials and thicknesses of the layers of the engineered substrate are selected such that both the absorption of the seed layer is less than 20%, preferably less than 10%, as well as total area-normalized series resistance of the engineered substrate is less than 10 mOhm·cm$^2$, preferably less than 5 mOhm·cm$^2$.

The seed layer is made of a first semiconductor material for growth of a solar cell and the support substrate is made of a second semiconductor material.

The method of manufacturing may further comprise that providing the seed layer is obtained by epitaxial growth.

The method of manufacturing may further comprise an ion implantation step for forming a weakened layer in a part of the first substrate or the seed layer before directly bonding the first and second bonding layers, and a detaching step to separate the remaining part of the first substrate or the seed layer (provided on the first substrate) after directly bonding the first and second bonding layers.

The method of manufacturing may further comprise a step of providing a metal contact on a second side of the support substrate opposite to the first side.

The engineered substrate as detailed above may be used for the manufacturing of CPV cells, MJ cells or any light detection devices.

DETAILED DESCRIPTION

Figure 1:
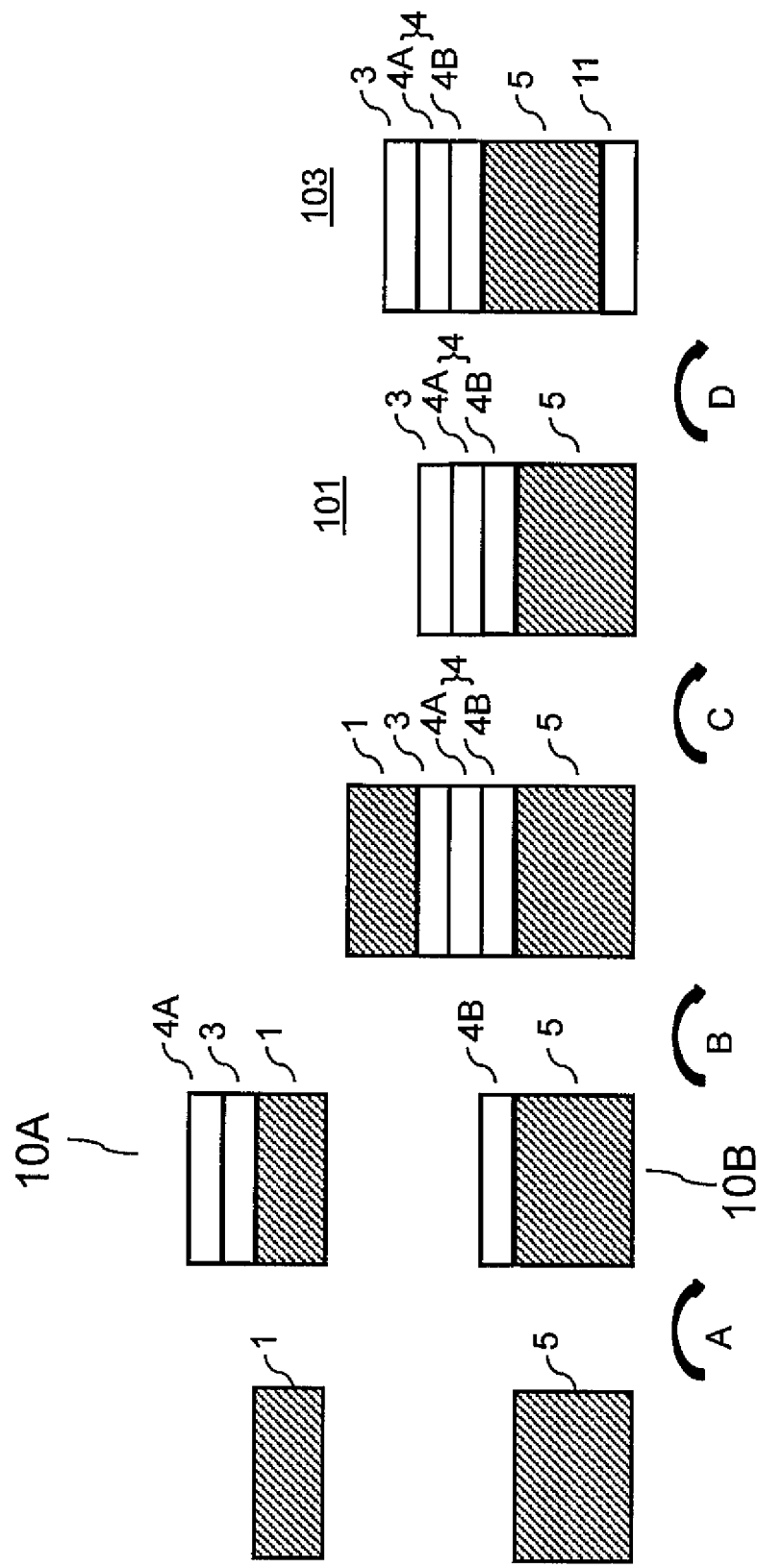
FIG. 1: Schematic drawing of one embodiment.

In FIG. 1, a first embodiment is depicted of a method of manufacturing an engineered substrate according to the present disclosure.

In a first step, in the leftmost part of FIG. 1, it is indicated that a support substrate 5 is provided. Furthermore, a first substrate 1 is provided. The first substrate 1 serves as an auxiliary substrate that, however, may be removed or sacrificed before the final engineered substrate is ready.

In a next step, as indicated by the arrow A, a seed layer 3 is formed on the first substrate 1. The seed layer 3 may be of a first semiconductor material. The first semiconductor material may be, e.g., InP or it may be a ternary or quaternary or penternary III-V material, for example, InGaAs or InGaAsP.

Furthermore, a first bonding layer 4A is formed on the seed layer 3. The first bonding layer 4A is a metallic layer; the material may be one of W or Ti together with TiN.

In principle, as indicated in FIG. 1, the first substrate 1, seed layer 3 and first bonding layer 4A may also be viewed as one structure 10A.

Furthermore, a second bonding layer 4B is formed on the support substrate 5. The second bonding layer 4B is also a metallic layer; the material may be one of W or Ti together with TiN. The second bonding layer 4B is grown, e.g., deposited by chemical vapor deposition (CVD), on a first side of the support substrate 5. The support substrate 5 and the second bonding layer 4B are made of a second semiconductor material. Typically, the second semiconductor material is GaAs or Ge. In principle, the support substrate 5 and the second bonding layer 4B together may be viewed as one structure 10B. The one structure 10B corresponds to a support substrate comprising the second bonding layer 4B being formed in the uppermost/top part of the support substrate 5.

No correlation in time between forming the two parts or structures 10A and 10B, respectively, i.e., the part comprising the seed layer formed on the first substrate and the part comprising the second bonding layer 4B being provided on the support substrate 5, is required, other that both are available at the beginning of the next step, which is indicated by an arrow B.

As illustrated in FIG. 1, in a next step indicated by B, the two structures are bonded together. That is, the structure 10A comprising the first substrate 1 with the seed layer 3 and the first bonding layer 4A is bonded together with the second structure 10B comprising the support substrate 5 and the second bonding layer 4B. In FIG. 1, this is depicted as if one of the structures 10A, 10B, here for purely exemplary reasons structure 10A, is flipped upside down so that the first bonding layer 4A and the second bonding layer 4B substantially contact each other. The first bonding layer 4A and the second bonding layer 4B then form a bonding interface 4 between both bonding layers. The bonding interface 4 may be a direct bonding interface. Typically, the bonding is performed by direct bonding of the two structures via the two bonding layers 4A, 4B. Direct bonding typically represents molecular adhesion between the two surfaces involved, without using any further bonding layers. Molecular adhesion is typically performed under partial vacuum. The bonding interface 4 comprising the first and second bonding layers 4A and 4B integrate the functionality of being both a bonding interface and due to the metallic nature of the bonding layers 4A, 4B also having a mirror function. Thus, by integrating a mirror function, the efficiency of the engineered substrate for use in light detection or conversion devices is increased. Integration of a mirror function at the bonding interface is further advantageous with respect to a mirror formed at the backside of the substrate because it gives more flexibility in the design of the support substrate with respect to the maintenance of low electrical resistance. Such support substrate may be highly doped in order to maintain low electrical resistance, which, however, induces higher absorption of photons as already pointed out.

Subsequently, in step C, the first substrate 1 is removed/detached from the first substrate 1, resulting in an engineered substrate 101 comprising an exposed seed layer 3. Removal of the first substrate 1 may be performed in various ways. Notably, grinding and/or back etching may be used to remove the first substrate 1, thereby eventually exposing the seed layer 3. If this treatment is chosen, the bonding process performed in the step before may be conducted at higher temperatures, e.g., temperatures in a range of 200° C.-600° C. or, more preferably, between 300° C.-500° C. Another possibility may be performing the transfer of the first structure 10A onto the second structure 10B prior to bonding by means of SMART CUT®, i.e., introducing an ion implantation step before bonding and then splitting/detaching, cf. FIG. 2. For this possibility, the bonding process should be carried out at a lower temperature, preferably less than 200° C.

Subsequently, in step D, an additional back side metal contact 11 may be provided on a second side of the support substrate 5 opposite to the first side, thereby resulting in an engineered substrate 103. The engineered substrate 103 may be substantially the same as the engineered substrate 101, except for having the additional back side metal contact. Step D and thus providing the additional back side metal contact 11 are optional, but may further improve the efficiency of the engineered substrate 103, and ultimately a solar cell including the engineered substrate. The back side metal contact 11 may serve as another mirror in addition to the mirror functionality of the bonding interface 4, i.e., its purpose is to reflect such photons that have not yet been converted in the substrate back into the interior. The back side metal contact 11 may also serve for providing an electrical contact to the back side of a solar cell, e.g., contacting a conductive plate in order to avoid complex wiring.

Figure 2:
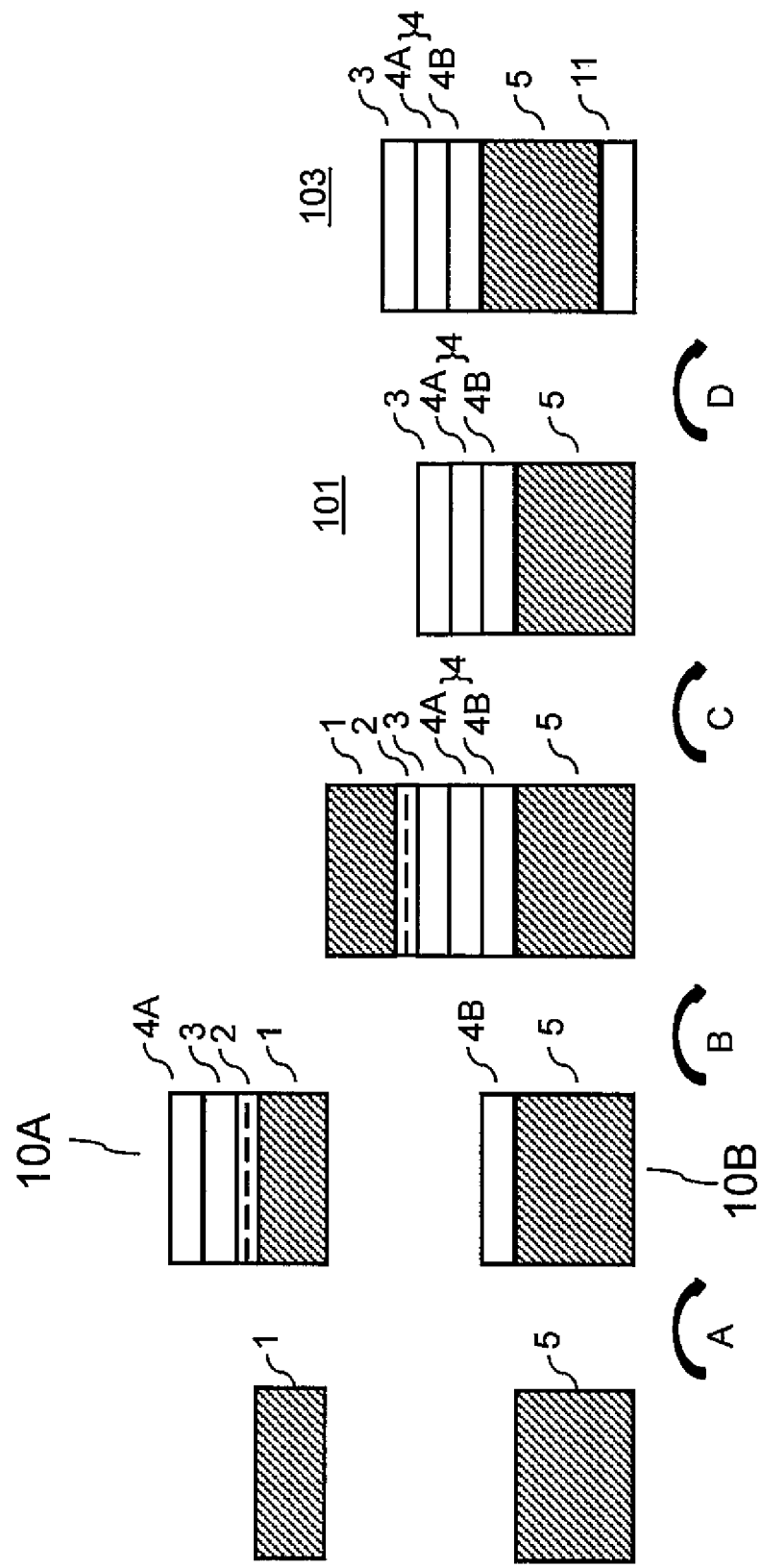
FIG. 2: A modification of the embodiment shown in FIG. 1.

FIG. 2 shows a slight modification of the embodiment of FIG. 1, however, sharing the same major steps A, B, C and optional step D. The same elements are denoted by the same reference numbers and will not be explained again. In FIG. 2, the first support substrate comprises a zipper layer 2, which is provided at the surface of the first substrate 1, representing the contact to the seed layer 3. For example, the zipper layer 2 may be provided in the form of a weakened layer formed by the implantation of ionic species. The ionic species may be, for example, hydrogen or helium ions. In this case, the first substrate 1 can be provided as a bulk substrate, such as an InP substrate, then the implantation through the top surface of the bulk substrate forms the weakened layer 2. The weakened layer or zipper layer 2 thus separates the seed layer 3 and the first substrate 1, respectively, in the top portion and the bottom portion of the bulk substrate. Subsequently, the first substrate 1 is detached from the seed layer 3 by means of the zipper layer 2, for example, the first engineered substrate is cleaved at the zipper layer 2 allowing the detachment of first substrate 1 from the seed layer 3. Then, the further process of detachment of the first substrate 1 may be mediated by the application of mechanical forces to delaminate at the weakened layer 2 formed by hydrogen or helium ions.

With respect to the above embodiment shown in FIG. 2, one understands that the seed layer 3 may be part of the first substrate 1 and is defined by the presence of the weakened layer 2. However, the present disclosure is not limited to such configuration. It is understood that the seed layer may be provided by epitaxial growth on the first substrate. An implantation step may thus define a weakened layer 2 either in the first substrate 1 or the seed layer. Such weakened layer 2 is formed in view of a subsequent detachment step as already explained above. Further surface preparation after such detachment (e.g., grinding, polishing, etching) of the transferred layer leaves behind a seed layer that is suitable for epitaxial growth (reduced roughness required), such as seed layer 3 bonded via metallic bonding layers (4A, 4B) to the support substrate 5.

The resulting engineered substrates 101 and 103, the latter including a back side metal contact, are substantially the same as in FIG. 1. The thickness of the seed layer 3 typically is in a range of 150 nm up to 1 If the transfer is performed by SMART CUT®, the thickness may be up to 300 nm, but can be as low as 20 nm. Furthermore, the thickness of the support substrate 5 may range from 100 μm up to 500 The doping concentration of the support substrate 5 typically ranges from $1 \times 10^{14}$-$5 \times 10^{17}$ at/cm$^3$. The first semiconductor material typically has a lattice constant in the range of 5.8-6 Å (0.58 nm-0.6 nm). The thickness of the bonding layers is in the range of 3 nm up to 2 preferentially in the range of 3 nm to 20 nm. In the latter case, due to low absorption within the bonding layers, which depends on the thickness, a second mirror on the back side may be applicable in order to further increase the efficiency.

Each of the engineered substrates 101 and 103 may be used in forming an MJ solar cell. The advantage is that materials of the various junctions may be tuned in order to better match the solar spectrum.

The invention claimed is:
1. An engineered substrate, the engineered substrate comprising:
   a seed layer made of a first semiconductor material for growth of a solar cell;
   a first bonding layer on the seed layer;
   a support substrate made of a second semiconductor material;
   a second bonding layer on a first side of the support substrate; and
   a bonding interface between the first and second bonding layers;
   where each of the first and second bonding layers are made of metallic material; and
   wherein doping concentrations of the first and second semiconductor materials and thicknesses of the seed layer, the support substrate, and both the first and second bonding layers, are selected such that the absorption of the seed layer is less than 20%, as well as a total area-normalized series resistance of the engineered substrate is less than 10 mOhm·cm$^2$.

2. The engineered substrate of claim 1, wherein the doping concentration of the seed layer is less than $5\times10^{17}$ at/cm$^3$.

3. The engineered substrate of claim 2, wherein the thickness of the seed layer is in a range extending from 150 nm to 1 µm.

4. The engineered substrate of claim 3, wherein the thickness of the support substrate is in a range extending from 100 µm to 500 µm and the doping concentration of the support substrate is in a range extending from $10^{14}$ to $5\times10^{17}$ at/cm$^3$.

5. The engineered substrate of claim 1, wherein the metallic material of the first and second bonding layers is one of W or Ti together with TiN.

6. The engineered substrate of claim 1, wherein the first semiconductor material has a lattice constant in a range extending from 5.8 Å to 6 Å.

7. The engineered substrate of claim 1, wherein the first semiconductor material is InP or a ternary or quaternary or penternary III-V material, and wherein the second semiconductor material is GaAs or Ge.

8. The engineered substrate of claim 1, further comprising a metal contact on a second side of the support substrate opposite to the first side.

9. A light detection or conversion device, comprising an engineered substrate according to claim 1.

10. The engineered substrate of claim 1, wherein the doping concentrations of the first and second semiconductor materials and the thicknesses of the seed layer, the support substrate, and both the first and second bonding layers, are selected such that the absorption of the seed layer is less than 10%.

11. The engineered substrate of claim 10, wherein the doping concentrations of the first and second semiconductor materials and the thicknesses of the seed layer, the support substrate, and both the first and second bonding layers, are selected such that the total area-normalized series resistance of the engineered substrate is less than 5 mOhm·cm$^2$.

12. The engineered substrate of claim 1, wherein the doping concentrations of the first and second semiconductor materials and the thicknesses of the seed layer, the support substrate, and both the first and second bonding layers, are selected such that the total area-normalized series resistance of the engineered substrate is less than 5 mOhm·cm$^2$.

13. The engineered substrate of claim 1, wherein the thickness of the seed layer is in a range extending from 150 nm to 1 µm.

14. The engineered substrate of claim 1, wherein the thickness of the support substrate is in a range extending from 100 µm to 500 µm and the doping concentration of the support substrate is in a range extending from $10^{14}$ to $5\times10^{17}$ at/cm$^3$.

15. A method of manufacturing an engineered substrate comprising:
providing a first substrate;
providing a seed layer on a first side of the first substrate;
forming a first bonding layer of metallic material on the seed layer;
providing a support substrate;
forming a second bonding layer of metallic material on the support substrate;
directly bonding the first and second bonding layers; and then;
removing the first substrate;
wherein doping concentrations of first and second semiconductor materials of layers of the engineered substrate and thicknesses of the seed layer, the support substrate, and both the first and second bonding layers, are selected such that absorption of the seed layer is less than 20%, as well as a total area-normalized series resistance of the engineered substrate is less than 10 mOhm·cm$^2$.

16. The method of claim 15, wherein providing the seed layer is obtained by epitaxial growth.

17. The method of claim 15, further comprising:
an ion implantation step for forming a weakened layer in a part of the first substrate or the seed layer before directly bonding the first and second bonding layers, and a detaching step to separate the remaining part of the first substrate or the seed layer provided on the first substrate after directly bonding the first and second bonding layers.

18. The method of claim 15, further comprising a step of providing a metal contact on a second side of the support substrate opposite to the first side.

19. The method of claim 15, wherein doping concentrations of the first and second semiconductor materials and thicknesses of the seed layer, the support substrate, and both the first and second bonding layers, are selected such that the absorption of the seed layer is less than 10%.

20. The method of claim 15, wherein doping concentrations of the first and second semiconductor materials and thicknesses of the seed layer, the support substrate, and both the first and second bonding layers, are selected such that the total area-normalized series resistance of the engineered substrate is less than 5 mOhm·cm$^2$.

* * * * *

UNITED STATES PATENT AND TRADEMARK OFFICE
CERTIFICATE OF CORRECTION

PATENT NO. : 11,251,321 B2
APPLICATION NO. : 16/074342
DATED : February 15, 2022
INVENTOR(S) : Eric Guiot et al.

Page 1 of 1

It is certified that error appears in the above-identified patent and that said Letters Patent is hereby corrected as shown below:

In the Specification
Column 6, Line 29, change "1 If" to --1 µm. If--
Column 6, Line 32, change "500 The" to --500 µm. The--
Column 6, Line 37, change "2 preferentially" to --2 µm, preferentially--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*